United States Patent
Ahn

(10) Patent No.: US 6,373,109 B1
(45) Date of Patent: Apr. 16, 2002

(54) SEMICONDUCTOR DEVICE TO MORE PRECISELY REFLECT THE CLAIMED INVENTION

(75) Inventor: Jae-Gyung Ahn, Cheongju (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 0 days.

(21) Appl. No.: 09/604,814

(22) Filed: Jun. 28, 2000

Related U.S. Application Data

(62) Division of application No. 09/335,048, filed on Jun. 16, 1999, now Pat. No. 6,110,771.

(30) Foreign Application Priority Data

Sep. 11, 1998 (KR) .............................................. 98-37610
Apr. 8, 1999 (KR) .............................................. 99-12332

(51) Int. Cl.$^7$ ............................................. H01L 31/119
(52) U.S. Cl. ...................................... 257/384; 438/300
(58) Field of Search ................................ 257/328, 384, 257/365, 382; 438/656, 234, 200, 281

(56) References Cited

U.S. PATENT DOCUMENTS

| | | | |
|---|---|---|---|
| 5,262,344 A | | 11/1993 | Mistry |
| 5,559,352 A | * | 9/1996 | Hsue et al. .................. 257/328 |
| 5,663,082 A | * | 9/1997 | Lee ............................ 438/234 |
| 6,022,769 A | * | 2/2000 | Wu ............................. 438/200 |
| 6,025,267 A | * | 2/2000 | Pey et al. .................... 438/656 |
| 6,096,609 A | * | 8/2000 | Kim et al. .................. 438/281 |

* cited by examiner

Primary Examiner—David Nelms
Assistant Examiner—Bau Le
(74) Attorney, Agent, or Firm—Birch, Stewart, Kolasch & Birch, LLP

(57) ABSTRACT

A semiconductor device and a fabrication method therefor improve electrostatic discharge (ESD) protecting property of an ESD protecting device in a fabrication method of a semiconductor device using a self-aligned silicide CMOS process. The semiconductor device has a silicide blocking portion which prevents a self-aligned silicified reaction by forming a gate electrode on drain and/or source of an ESD protecting device and simultaneously forming a dummy gate electrode which is separated from the gate electrode.

4 Claims, 4 Drawing Sheets

SEMICONDUCTOR DEVICE TO MORE PRECISELY REFLECT THE CLAIMED INVENTION

This application is a divisional of co-pending application Ser. No. 09/335,048, filed on Jun. 16, 1999, now U.S. Pat. No. 6,110,771 the entire contents of which are hereby incorporated by reference.

BACKGROUND OF THE INVENTION

1. Field of the Invention

The present invention relates to a semiconductor device, and more particularly to a semiconductor device and fabrication method therefor that prevents electrostatic discharge failure withstand voltage drop in a fabrication method of a semiconductor device using a self-aligned silicide CMOS process.

2. Description of the Conventional Art

A self-aligned silicide (salicide) source/drain process is widely applied to most of the currently used integrated circuit devices to increase the operation speed of a circuit. That is, the overall resistance of a semiconductor device can be reduced by forming a silicide which has low resistance on source/drain regions, thus accordingly achieving high-speed operation of the semiconductor device.

However, an electrostatic discharge (ESD) failure voltage of an ESD protecting device of a semiconductor device which is fabricated by the salicide source/drain process is considerably lower than an ESD failure voltage of a semiconductor device which is fabricated by a general non-silicide source/drain process, which results in deterioration of a product, meaning that the salicide source/drain process has a reverse effect on the ESD protecting characteristic. Since a drain of the ESD protecting device of the non-silicide source/drain structure has an appropriate resistance value, when a high ESD failure voltage is applied thereto, the drain thereof operates as a ballast and thus a withstand voltage to the ESD is high. But, the drain resistance decreases by forming the silicide on the source/drain regions and eventually no ballasting effect of the drain is shown, thereby reducing the ESD failure voltage. Accordingly, to solve such a problem, there is provided a method of fabricating a semiconductor device wherein a silicide blocking portion is formed with respect to the whole ESD protecting device when forming a salicide layer on the source/drain regions, so that the silicide may not be formed on the ESD device.

In other words, the salicide source/drain process is only performed to elements constituting an internal circuit among constituent circuits of the integrated circuit and a silicide blocking layer is formed on the ESD protecting device, thereby forming the non-silicide source/drain structure. The fabrication method of the conventional semiconductor device will be explained with reference to FIGS. 1A through 1D.

In FIGS. 1A through 1D, a transistor which is shown in the left-hand side of each dotted line is an internal circuit transistor, while a transistor in the right-hand side is an ESD transistor, and a connecting structure of the internal circuit and the ESD transistor is not illustrated to briefly explain the fabrication method therefor. First, as shown in FIG. 1A, a device isolation region 2 is formed by applying a shallow trench process to a semiconductor substrate 1. Here, the shallow trench process is a device isolating method wherein a shallow trench is formed at a portion where the device isolation region of the semiconductor substrate is to be formed and an insulating film such as an oxide film is filled in the trench, so that adjacent devices are not electrically connected.

Next, the internal circuit transistor and the ESD transistor are formed at the semiconductor substrate 1 by a well-known MOS transistor fabrication method. That is, gate insulating films 3 are formed on the semiconductor substrate 1, a polysilicon layer is formed on the gate insulating films 3 and then selectively patterned, for thereby forming polysilicon gate electrodes 4. Next, lightly doped drains (LDD) 5 are formed by doping low density impurity ions into the semiconductor substrate 1 by a self-aligned method using the polysilicon gate electrodes 4 as masks, and an insulating film at a uniform thickness is formed over the entire resultant surface of the semiconductor substrate 1 and the insulating film is etched by an anisotropic etching process, thereby forming sidewall spacers 6 on side surfaces of the polysilicon gate electrodes 4. Next, source/drain regions 7 are formed by implanting impurity ions into the semiconductor substrate 1 using the sidewall spacers 6 and the polysilicon gate electrodes 4 as masks. As shown in FIG. 1B, an insulating film which serves as a protection film 8 is deposited over the resultant structure of the semiconductor substrate 1 and, as shown in FIG. 1C, a portion of the protection film 8 corresponding to a portion where the internal circuit transistor is to be formed is selectively etched and removed, so that the protection film 8 only remains on the ESD transistor. Then, as shown in FIG. 1D, a self-aligned silicide 9 is formed on the source/drain regions 7 and the polysilicon gate electrode 4 of the internal circuit transistor region by the well-known self-aligned method.

However, the conventional fabrication method for the semiconductor device has several disadvantages.

First, since the protection film must be formed for controlling the formation of the salicide layer, the deposition and the photo-etching process are additionally provided, so that the fabrication process is complicated. Second, because the process for depositing the protection film is accomplished after fabricating the transistor, the characteristics of the transistor which has been previously fabricated are changed due to a heat treatment process which accompanies the depositing process. Third, when removing the protection film formed on the internal circuit transistor, a field oxide film of the device isolation region is damaged due to over-etching, which results in deterioration of the electrical characteristics, such as radical increase in junction leakage current. Finally, when a material of the protection film is oxide, oxygen permeates through the source/drain regions and the polysilicon gate electrodes of the internal circuit transistor which makes it difficult to perform the silicide forming process.

SUMMARY OF THE INVENTION

Accordingly, the present invention is directed to a fabrication method of a semiconductor device which obviates the problems and disadvantages due to the conventional art.

An object of the present invention is to provide a fabrication method of a semiconductor device that enables a semiconductor device to stably operate by eliminating a process of depositing a protection film which accompanies a heat treatment after fabricating an internal circuit transistor and an ESD transistor which has been employed in the conventional art, thereby preventing the change of characteristics of a transistor thereof.

To achieve these and other advantages and in accordance with the purpose of the present invention, as embodied and broadly described, there is provided a semiconductor device and a fabrication method therefor that prevent a self-aligned silicified reaction by forming a gate electrode on a drain of an ESD protecting device and simultaneously forming a dummy gate electrode which is separated from the gate electrode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 1A:
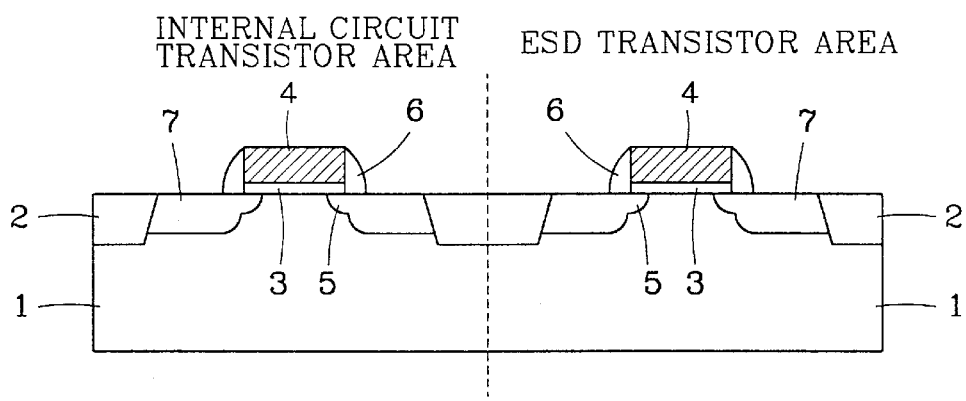
FIGS. 1A through 1D are vertical cross-sectional views sequentially illustrating a fabrication method of a conventional semiconductor device.
Figure 1B:
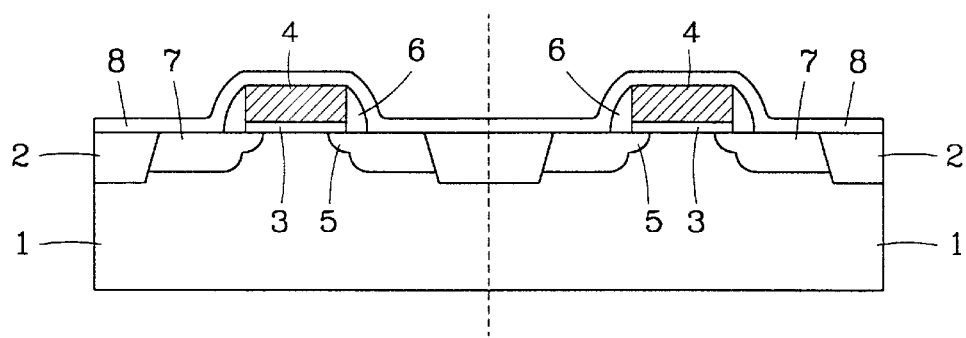
Figure 1C:
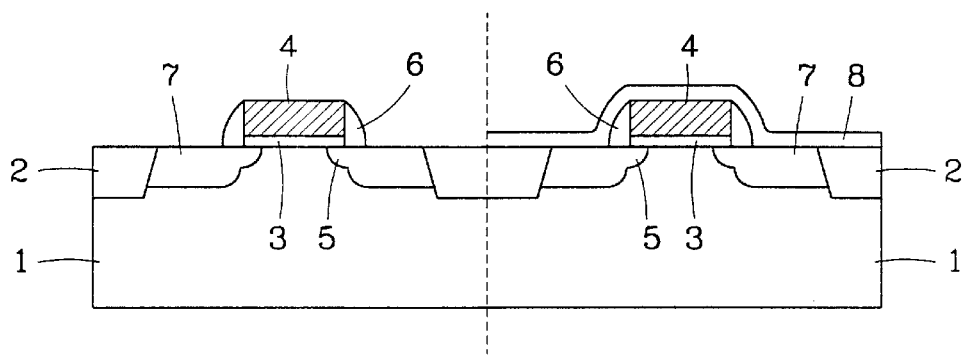
Figure 1D:
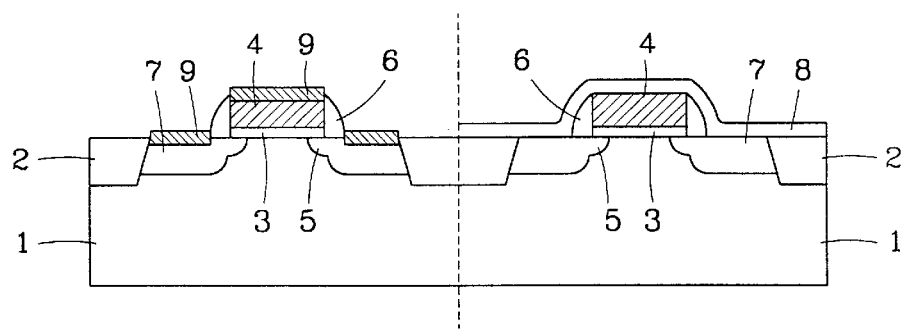
Figure 2:
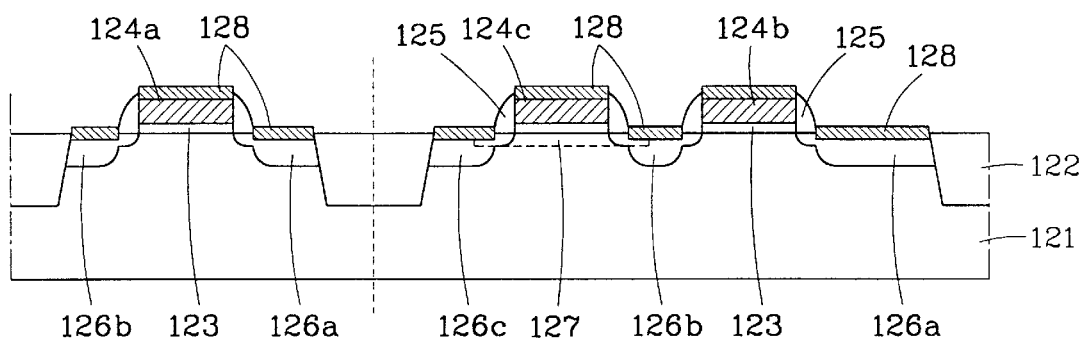
FIG. 2 is a cross-sectional view illustrating a semiconductor device according to a first embodiment of the present invention.

A semiconductor device according to a first embodiment of the present invention will now be illustrated with reference to FIG. 2. Here, it is to be noted that with a dotted line in the center, an internal circuit of a semiconductor integrated circuit is shown at the left-hand side and an ESD protecting device is shown at the right-hand side.

As shown therein, a semiconductor substrate 121 consists of an internal circuit device region A and an ESD protecting device region B. A plurality of device isolation regions 122 are formed at predetermined portions of the semiconductor substrate 121 and the other region of the semiconductor substrate 121 is an active region on which a gate oxide film 123 is formed. In addition, gate electrodes 124a, 124b are formed on the gate oxide film 123, the gate electrode 124a being a gate electrode of the internal circuit device formed on the gate oxide film 123 of the internal circuit device region A and the gate electrode 124b being a gate electrode of the ESD protecting device formed on the gate oxide film 123 of the ESD protecting device region B. Further, a dummy gate electrode 124c is formed between the gate electrode 124b and the device isolation region 122, being separated from the gate electrode 124b, on the ESD protecting device region B of the semiconductor substrate 121. here, it is noted that the dummy gate electrode 124c is an electrode which does not receive a voltage when operating the semiconductor device and simply formed to prevent a silicide layer from being formed on impurity layers 126, that is drains of the ESD protecting device. Further, sidewall spacers 125 are formed on side surfaces of the gate electrodes 124a, 124b and the dummy gate electrode 124c, respectively.

While, in the semiconductor substrate 121, impurity layers 126a, 126b are respectively formed between the gate electrode 124a and the device isolation region 122 and between the gate electrode 124b and the device isolation region 122, the impurity layers 126a and 126b serving as a source and a drain, respectively, of the transistor. More specifically, the impurity layer 126b which is formed in the semiconductor substrate 121 between the gate electrode 124b and the dummy gate electrode 124c serves as the drain of the ESD protecting device. An impurity layer 126c is formed between the dummy gate electrode 124c and the device isolation region 122 in the semiconductor substrate 121, the impurity layer 126c serving as a part of the drain of the ESD protecting device and being a drain-wire contact portion which is connected to wires (not shown) for electrically connecting various devices formed at the semiconductor substrate 121.

An impurity layer 127 which electrically connects the impurity layer 126c of the drain-wire contact portion to the impurity layer 126b serving as the drain of the ESD protecting device is formed in the semiconductor substrate 121 under the dummy gate electrode 124c. Further, a silicide layer 128 is formed on the gate electrodes 124a, 124b, the dummy gate electrode 124c and the impurity layers 126a, 126b, 126c. The dummy gate electrode 124c of a polysilicone layer, instead of the silicide layer, as well as the gate electrodes 124a, 124b are formed on a portion of the drain of the ESD protecting device, thereby maintaining high drain resistance. Also, the semiconductor device according to the present invention decreases wire contact resistance by forming the silicide layer 128 on the impurity layers at the drain-wire contact portion.

Figure 3:
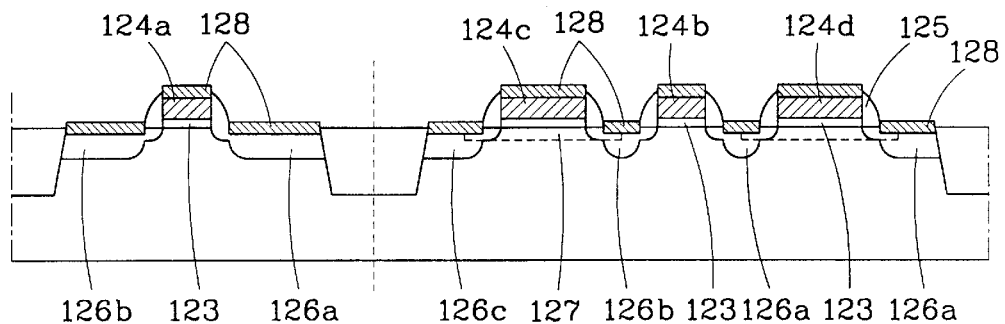
FIG. 3 is a cross-sectional view illustrating a semiconductor device according to a second embodiment of the present invention.

FIG. 3 is a cross-sectional view illustrating a semiconductor device according to a second embodiment of the present invention. The difference between the semiconductor devices according to the first and second embodiments of the present invention is in that in the first embodiment the dummy gate electrode 124c is formed on the drain of the ESD protecting device, while in the second embodiment a dummy gate electrode 124d is formed on a drain and a source of an ESD protecting device, and in the second embodiment of the present invention an impurity layer 127 is formed in a semiconductor substrate 121 under the dummy gate electrode 124d. Accordingly, those elements which are the same as the elements in the semiconductor device according to the first embodiment of the present invention are given the same reference numbers.

With reference to FIGS. 4A through 4D, the fabrication method for the semiconductor device according to the first embodiment of the present invention will now be described. Here, it is also noted that with a dotted line in the center, a transistor constituting an internal circuit of an integrated circuit is shown at the lefthand side and a transistor of an ESD protecting device at the right-hand side.

Figure 4A:
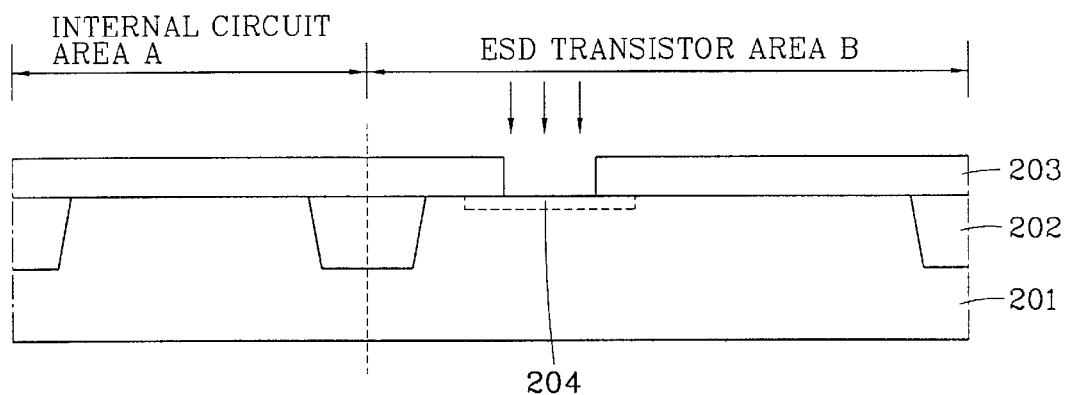
FIGS. 4A through 4D are vertical cross-sectional views sequentially illustrating a fabrication method for the semiconductor device according to the first embodiment of the present invention.

First, as shown in FIG. 4A, there is provided a p-type semiconductor substrate 201 which includes an internal circuit transistor region A and an ESD transistor region B, and a device isolation region 202 is formed on the p-type semiconductor substrate 201 by a well-known device isolating process such as a local oxidation of silicon (LOCOS) process or a shallow trench process. Here, the other region except for the device isolation region 202 in the semiconductor substrate 201 is an active area.

A photoresist layer is formed over an entire surface of the P-type semiconductor substrate 201 and then patterned for partially exposing the upper surface of the semiconductor substrate 201 of the ESD transistor region B, thereby forming a photoresist pattern 203. Next, n-type impurity ions are implanted into the exposed portion of the semiconductor substrate 201, using the photoresist pattern 203 as a mask, for thereby forming a first impurity layer 204.

Figure 4B:
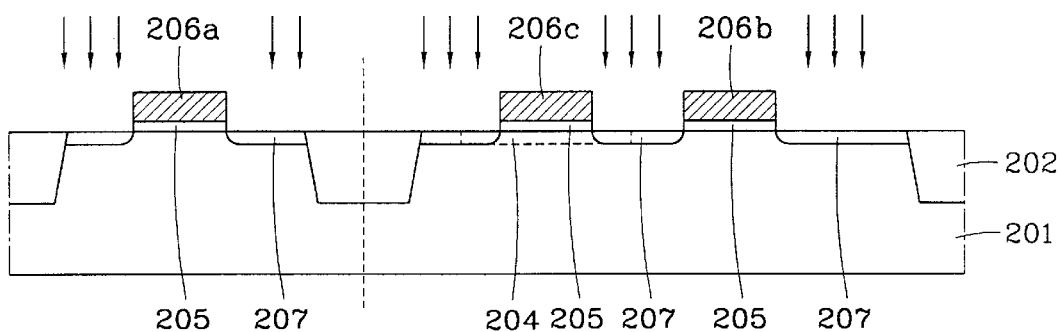

As shown in FIG. 4B, the photoresist pattern 203 is stripped off to be removed and then a gate oxide film 205 of silicon oxide or silicon nitride is formed on the semiconductor substrate 201. A layer for forming a gate electrode, for example, a polysilicon layer is formed on the gate oxide film 205 and then patterned, thereby forming a gate electrode 206a of the internal circuit transistor at the region A and a gate electrode 206b of the ESD transistor 206b at the region B, respectively. Here, with the forming of the gate electrodes 206a, 206b, a dummy gate electrode 206c is formed on the first impurity layer 204, being separated from the gate electrode 206b of the ESD transistor. The dummy gate electrode 206c prevents a silicide from being formed on the drain of the ESD transistor in a following silicide forming process. In other words, in the fabrication of the semiconductor device according to the preferred embodiment of the present invention, the silicide blocking portion, that is, the dummy gate electrode 206c is formed before fabricating the transistor, thereby preventing change of characteristics of the transistor. Also, since the silicide blocking portion, the dummy gate electrode 206c, is formed simultaneously with the forming of the internal circuit and ESD transistor gate electrodes, the fabrication process thereof becomes simpler compared with that of the conventional art.

Next, a second impurity layer 207 is formed by implanting n-type impurity ions into the semiconductor substrate 201 using the gate electrodes 206a, 206b and the dummy gate electrode 206c as masks, the second impurity layer 207 having shallower depth and lower density than a third impurity layer 209 which is to be formed in a following process. The second impurity layer 207 is generally called a lightly doped drain (LDD).

Figure 4C:
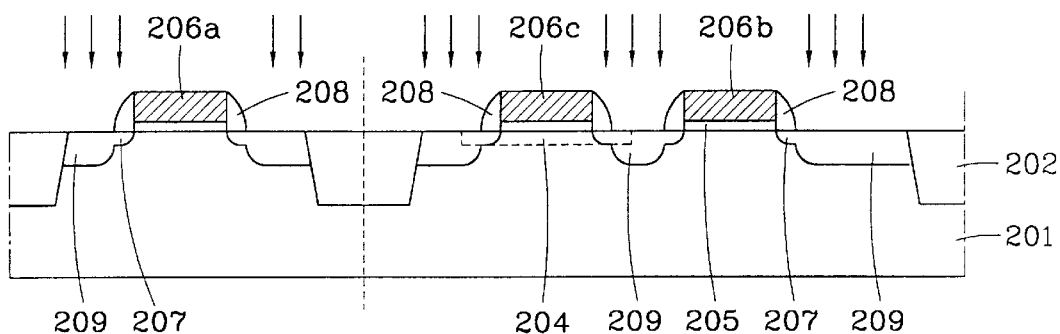

As shown in FIG. 4C, a silicon nitride which serves as an insulating film is formed on the resultant surface of the semiconductor substrate 201 and sidewall spacers 208 are formed at side surfaces of the gate electrodes 206a, 206b and the dummy gate electrode 206c, respectively, by performing the anisotropic etching process. Then, the third impurity layer 209 is formed by implanting n-type impurity ions into the semiconductor substrate 201 using the sidewall spacers 208, the gate electrodes 206a, 206b and the dummy gate electrode 206c as masks. The third impurity layer 209, which has shallower depth and lower density than the second impurity layer, serves as source/drain of the internal circuit transistor and the ESD transistor together with the first and second impurity layers 204, 207.

Figure 4D:
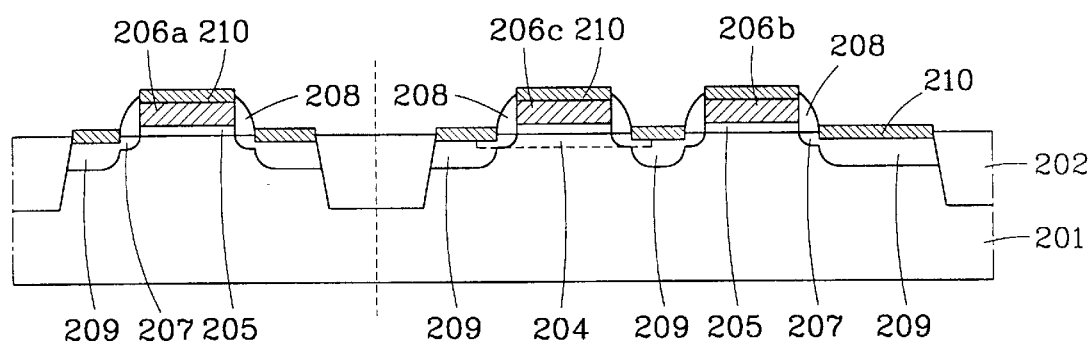

As shown in FIG. 4D, there is formed a metal layer, such as Ti, Co, Pt, Ni, Pd, Cr, Mo, Ta, W, on the resultant surface of the FIG. 4C and then a heat treatment is performed at a temperature of 650–730° C. for having silicified reaction between the silicon and the metal layer, thereby forming a silicide layer 210, and then a portion of the metal layer where the silicified reaction does not occur is selectively removed. As a result, the silicide layers 210 are formed on the gate electrode 206a at the internal circuit transistor, the gate electrode 206b at the ESD transistor, the dummy gate electrode 206c and third impurity layer 209, respectively. Further, although in the fabrication method of the semiconductor device with reference to FIGS. 4A through 4D, the method of forming the silicide blocking portion, that is, the dummy gate electrode on the drain is only described, it is also possible to form the dummy gate electrode on the source region of the transistor. In the semiconductor device according to the first and second embodiments of the present invention, the n-type impurity ions are implanted into the p-type semiconductor substrate to fabricate the transistor. However, it is possible that p-type impurity ions are implanted into an n-type semiconductor substrate. In addition, it is also to form p-type wells by implanting the p-type impurity ions into the n-type semiconductor substrate and fabricate an internal circuit transistor and an ESD transistor in the p-type wells. As described above, a protection film depositing process and a photo-etching process for forming a suicide layer in the source/drain regions of the ESD transistor are not required when fabricating the semiconductor device according to the present invention, thereby having a simpler fabrication process compared with the conventional art. Further, since the silicide blocking portion is formed before forming the transistor, that is the silicide blocking portion is formed with the forming of the gate electrodes of the internal circuit and the ESD transistor of the semiconductor device, the heat temperature is not required after fabricating the transistor, thereby avoiding a problem in that device characteristics of the transistor are changed and thus improving the reliability of the semiconductor device. In addition, the semiconductor device according to the present invention solves the junction leakage current increase due to the insulating film damage of the device isolation region which was incurred in the conventional art when etching the protection film formed on the internal circuit, thus improving the reliability of the semiconductor device. Further, the silicide layer is formed on the gate electrode of the ESD transistor, thereby improving the signal transmitting characteristic of the gate electrodes. Finally, since the silicide layer is formed in the source/drain-wire contact portion of the ESD transistor, the contact resistance is decreased, which results in an improvement in the performance of the semiconductor device.

It will be apparent to those skilled in the art that various modifications and variations can be made in the semiconductor device and fabrication method therefor of the present invention without departing from the spirit or scope of the invention. Thus, it is intended that the present invention cover the modifications and variations of this invention provided they come within the scope of the appended claims and their equivalents.

What is claimed is:

1. A semiconductor device, comprising:
   a semiconductor substrate of a first conductive type having an internal circuit device region and an electrostatic discharge (ESD) protecting device region;
   a first impurity layer of a second conductive type formed in the ESD protecting device region of the semiconductor substrate;
   gate electrodes formed on the internal circuit device region and the ESD protecting device region, respectively, of the semiconductor substrate;
   a dummy gate electrode formed on the first impurity layer;
   a second impurity layer of the second conductive type formed in the semiconductor substrate at both sides of the gate electrodes and the dummy gate electrode, respectively; and
   a silicide layer formed on the gate electrodes, the dummy gate electrode and the second impurity layer.

2. The semiconductor device according to claim 1, wherein the silicide layer includes at least one metal element of Ti, Co, Pt, Ni, Pd, Cr, Mo, Ta and W.

3. The semiconductor device according to claim 1, wherein the first conductive type has the opposite type to the second conductive type.

4. The semiconductor device according to claim 1, wherein the gate electrodes and the dummy gate electrode are polysilicon.

* * * * *